(12) United States Patent
Iwasaki et al.

(10) Patent No.: US 12,432,893 B2
(45) Date of Patent: Sep. 30, 2025

(54) COMPONENT SUPPLY UNIT ARRANGEMENT HANDLING SYSTEM

(71) Applicant: FUJI CORPORATION, Chiryu (JP)

(72) Inventors: Masataka Iwasaki, Anjo (JP); Mizuho Nozawa, Kota-cho (JP); Shinichiro Uchida, Anjo (JP)

(73) Assignee: FUJI CORPORATION, Chiryu (JP)

( * ) Notice: Subject to any disclaimer, the term of this patent is extended or adjusted under 35 U.S.C. 154(b) by 376 days.

(21) Appl. No.: 17/791,705

(22) PCT Filed: Jan. 14, 2020

(86) PCT No.: PCT/JP2020/000930
§ 371 (c)(1),
(2) Date: Jul. 8, 2022

(87) PCT Pub. No.: WO2021/144863
PCT Pub. Date: Jul. 22, 2021

(65) Prior Publication Data
US 2023/0037598 A1 Feb. 9, 2023

(51) Int. Cl.
*H05K 13/02* (2006.01)
*H05K 13/08* (2006.01)

(52) U.S. Cl.
CPC ......... *H05K 13/021* (2013.01); *H05K 13/086* (2018.08)

(58) Field of Classification Search
CPC ........... H05K 13/0495; H05K 13/0882; H05K 13/086; H05K 13/021
See application file for complete search history.

(56) References Cited

U.S. PATENT DOCUMENTS 10,820,459 B2 * 10/2020 Kondo .................. H05K 13/08
2020/0103880 A1 * 4/2020 Nozawa ............... H05K 13/021
(Continued)

FOREIGN PATENT DOCUMENTS

JP 2014-197594 A 10/2014
JP 2018-125383 A 8/2018
(Continued)

OTHER PUBLICATIONS

International Search Report issued Mar. 24, 2020 in PCT/JP2020/000930 filed Jan. 14, 2020, 3 pages.

*Primary Examiner* — Kaitlin S Joerger
(74) *Attorney, Agent, or Firm* — Oblon, McClelland, Maier &Neustadt, L.L.P.

(57) ABSTRACT

A component supply unit set-up system includes a container warehouse configured to store multiple component containers for containing multiple components, a unit storage shed configured to store multiple component supply units used when the component, which is contained in the component container, is supplied in a mounting operation performed by a component mounter, a work table disposed between the container warehouse and the unit storage shed and used for a loading operation of loading the component supply unit with the component container, a container conveyance robot configured to convey the component container between the container warehouse and the work table, and a unit conveyance robot configured to convey the component supply unit between the unit storage shed and the work table.

14 Claims, 5 Drawing Sheets

(56) References Cited

U.S. PATENT DOCUMENTS

| | | | | |
|---|---|---|---|---|
| 2020/0125073 | A1* | 4/2020 | Nozawa | G08B 5/22 |
| 2021/0120714 | A1* | 4/2021 | Brown | H05K 13/021 |
| 2022/0411185 | A1* | 12/2022 | Kawai | H05K 13/086 |
| 2023/0363131 | A1* | 11/2023 | Nakayama | H05K 13/0882 |
| 2024/0074132 | A1* | 2/2024 | Oyama | H05K 13/085 |

FOREIGN PATENT DOCUMENTS

| | | |
|---|---|---|
| JP | 2019-91771 A | 6/2019 |
| WO | WO 2018/127956 A1 | 7/2018 |
| WO | WO 2019/142336 A1 | 7/2019 |
| WO | WO 2019/159319 A1 | 8/2019 |

* cited by examiner

COMPONENT SUPPLY UNIT ARRANGEMENT HANDLING SYSTEM

TECHNICAL FIELD

The present specification relates to a set-up system corresponding to a loading operation for loading a component supply unit with a component container and related operations before and after the loading operation.

BACKGROUND ART

A technique of mass-producing board products by performing board work on a board on which printed wiring is performed has become widespread. Further, it is common to provide multiple types of board work machines for performing the board work side by side so as to configure a board work line. A component mounter among the board work machines uses a component supply unit loaded with the component container that contains multiple components. The loading operation (set-up work) for loading the component supply unit with the component container is often performed in a set-up area distant from the component mounter being operated (external set-up).

This loading operation has been conventionally performed by human hand and requires a lot of labor. Further, the loading operation is performed ahead of schedule to ensure that the production plan is achieved, which increases the number of work-in-process component supply units that cannot be diverted to other uses. Therefore, the management is complicated and further labor is required. In recent years, for the purpose of labor saving, a container loader that automates at least a part of the loading operation has been put into practical use. One example of a technique related to the automation of the loading operation is disclosed in Patent Literature 1.

A second embodiment of Patent Literature 1 describes a configuration including a storage shed for storing a reel (one example of the component container), a storage shed for storing a feeder (one example of the component supply unit), a reel set device (one example of the container loader), a conveyance device, and a management section. The reel set device performs the loading operation for setting a reel to a feeder. The conveyance device conveys the set-up feeder to the component mounter. The management section controls the delivery, the loading operation, the conveyance operation, or the like of the reels and the feeders, and manages the production of the component mounter. According to this configuration, it is said that the combination and the location of the reel and the feeder can be easily recognized so that the real and the feeder can be easily managed.

PATENT LITERATURE

Patent Literature 1: International Publication No. 2019/142336

BRIEF SUMMARY

Technical Problem

Incidentally, in the reel set device of Patent Literature 1, it is preferable that the loading operation itself is automated to achieve labor saving. However, the operation of conveying the reel and the feeder from the storage shed to the reel set device or the operation of loading the set-up feeder on the conveyance device is manually performed. In other words, the related operations before and after the loading operation still require human hands.

An object of the present specification is to provide a component supply unit set-up system that automates a loading operation for loading a component supply unit with a component container and related operations before and after the loading operation.

Solution to Problem

The present specification discloses a component supply unit set-up system including a container warehouse configured to store multiple component containers for containing multiple components, a unit storage shed configured to store multiple component supply units used when the component, which is contained in the component container, is supplied in a mounting operation performed by a component mounter, a container loader configured to load the component supply unit with the component container, a container conveyance robot configured to convey the component container between the container warehouse and the container loader, and a unit conveyance robot configured to convey the component supply unit between the unit storage shed and the container loader.

Advantageous Effects

In a component supply unit set-up system of the present specification, a component container is conveyed from a container warehouse to a container loader by a container conveyance robot, and a component supply unit is conveyed from a unit storage shed to the container loader by a unit conveyance robot. Further, the container loader automatically performs a loading operation for loading the component supply unit with the component container. Further, the component supply unit, which is loaded with the component container by using the loading operation, can be returned to the unit storage shed by the unit conveyance robot. Accordingly, automation of the loading operation and the related operations such as transportation before and after the loading operation is achieved.

DESCRIPTION OF EMBODIMENTS

Figure 1:
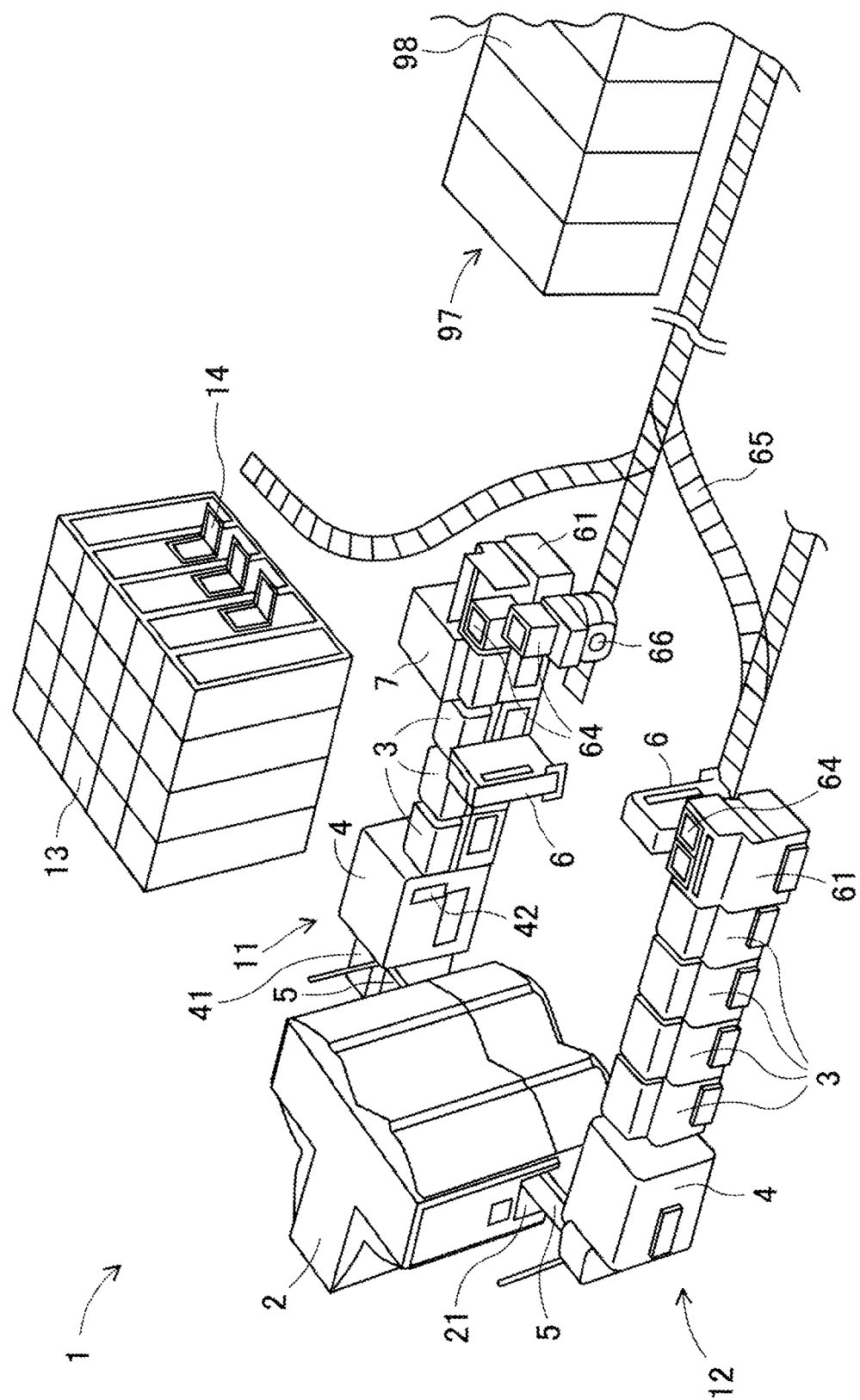
FIG. 1 is a perspective view conceptually illustrating an overall configuration of a component supply unit set-up system of a first embodiment.

1. Configuration of Component Supply Unit Set-Up System 1 of First Embodiment The configuration of component supply unit set-up system 1 of a first embodiment will be described with reference to an overall configuration view of FIG. 1, a partially enlarged view of FIG. 2, and a functional block diagram of FIG. 3. Set-up system 1 corresponds to a loading operation for loading component supply unit 92 with component container 91 and the related operations before and after the loading operation. Set-up system 1 is configured to include container warehouse 2, first set-up line 11, second set-up line 12, unit warehouse 13, and the like. Container warehouse 2 is illustrated on the left side of the drawing in FIG. 1, board work line 97 is illustrated on the right side of the drawing, and second set-up line 12, first set-up line 11, and unit warehouse 13 are illustrated from the direction of the lower left side to the direction of the upper right side of the drawing.

Component container 91 contains multiple components. Component supply unit 92 is used when supplying the components contained in component container 91 in a mounting operation performed by component mounter 98. Identification codes indicating each type or individual are attached to component container 91 and component supply unit 92. The identification code of component container 91 includes information indicating the type of the component contained in component container 91. As the identification code, a barcode, a two-dimensional code, or the like is used.

As component container 91, a tape reel can be exemplified, and as component supply unit 92, an integral type feeder device in which the tape reel is directly loaded can be exemplified. A carrier tape in which multiple components are sealed at a predetermined pitch is wound and held on the tape reel. The feeder device is installed on component mounter 98 in a form in which the tape reel is loaded. The feeder device supplies the component to a component mounting tool of component mounter 98 by pulling out the carrier tape from the tape reel and sending the carrier tape to a component pick up position. When the mounting operation of the component proceeds and the component of the tape reel is consumed, the entire feeder device is exchanged.

The feeder device is not limited to an integral type and may be a separate type. The separate type feeder device is configured to include a feeder main body portion having a feeding mechanism of the carrier tape and a reel cassette in which the tape reel is loaded. The feeder main body portion is permanently provided in component mounter 98, and the separate reel cassette is disposed in the vicinity of the feeder main body portion. When the mounting operation of the component proceeds and the component of the tape reel is consumed, the reel cassette is exchanged. The reel cassette corresponds to component supply unit 92 in which component container 91 is loaded.

Hereinafter, a case where component supply unit 92 is an integral type feeder device and component container 91 is a tape reel will be described. A tray may be used as component container 91, and a tray loading unit may be used as component supply unit 92.

Container warehouse 2 stores multiple component containers 91 so as to enable the supply to first set-up line 11 and second set-up line 12. As illustrated in FIG. 1, container warehouse 2 is formed in a large box shape having a substantially T-shape in plan view. Container warehouse 2 includes a storage port on a side face corresponding to a lower end of the T-shape, and includes delivery port 21 on each side face corresponding to left and right ends of the T-shape. Component container 91 is stored from the storage port by an operator. In FIG. 1, delivery port 21 toward first set-up line 11 is not visible, and delivery port 21 toward second set-up line 12 is illustrated.

Figure 3:
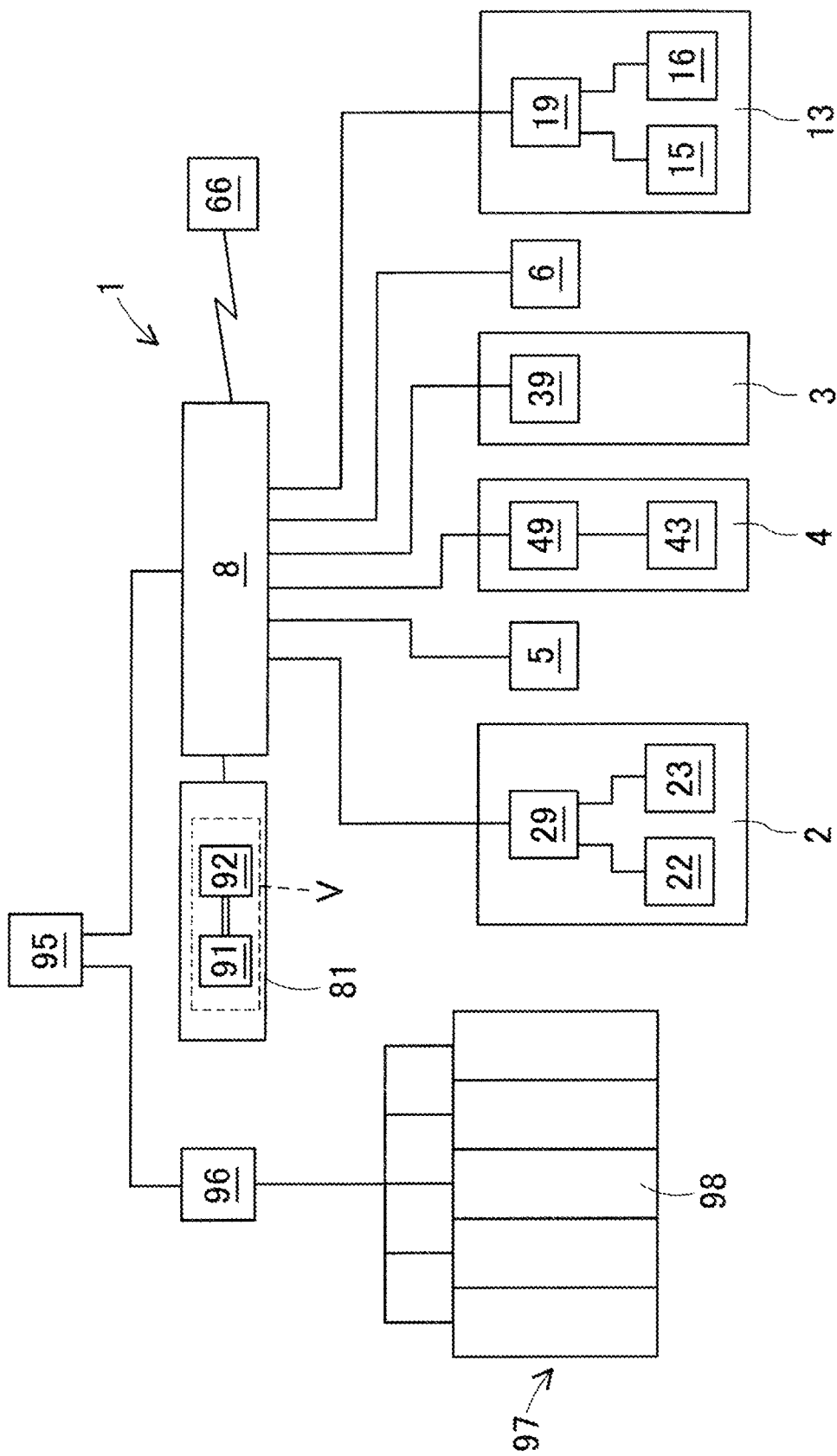
FIG. 3 is a functional block diagram illustrating a configuration of control in the first embodiment.

As illustrated in FIG. 3, multiple storing positions, actuator 22, and code reader 23 are provided in container warehouse 2. Actuator 22 sends component container 91 stored in the storage port to the storing position and sends component container 91 in the storing position to either of two delivery ports 21. Actuator 22 is controlled by container warehouse control section 29. Code reader 23 reads the identification code attached to stored component container 91 and delivers the read result to container warehouse control section 29. Therefore, container warehouse control section 29 can recognize the individuals of all stored component containers 91 in association with the storing positions.

Unit warehouse 13 illustrated in FIG. 1 is separate from unit storage shed 3 described later, and stores more component supply units 92 than unit storage shed 3. Component supply unit 92 stored in unit warehouse 13 does not matter whether component container 91 is loaded. Unit warehouse 13 includes multiple storing positions, three storage and delivery ports 14, actuator 15, code reader 16, and unit warehouse control section 19 (see FIG. 3).

Actuator 15 sends component supply unit 92 stored in storage and delivery port 14 to the storing position and sends component supply unit 92 in the storing position to any of three storage and delivery ports 14. Actuator 15 is controlled by unit warehouse control section 19. Code reader 16 reads the identification code attached to stored component supply unit 92 and delivers the read result to unit warehouse control section 19. Therefore, unit warehouse control section 19 can recognize the individuals of all stored component supply units 92 in association with the storing positions.

Figure 2:
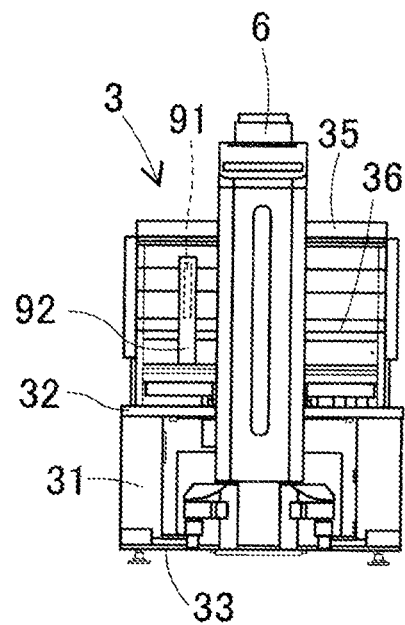
FIG. 2 is an enlarged front view of a unit storage shed and a unit conveyance robot.

As illustrated in FIG. 1, first set-up line 11 is configured to include three unit storage sheds 3, container loader 4, container conveyance robot 5, unit conveyance robot 6, maintenance device 7, and landing station 61. Unit storage shed 3 stores multiple component supply units 92. As illustrated in FIG. 2, unit storage shed 3 includes base 31 and storage rack 35. Base 31 is formed in a rectangular parallelepiped frame shape. Upper section guide 32 extending in the left-right direction is provided on an upper portion of the front face of base 31. Lower section guide 33 extending in the left-right direction is provided on a lower portion of the front face of base 31. Upper section guide 32 and lower section guide 33 are formed in, for example, a protrusion shape protruding ahead or a groove shape opened upward.

Storage rack 35 is formed in a box shape opening on the front side and is fixed to an upper portion of base 31. Multiple storage slots arranged in the left-right direction are formed on a bottom face of the inner side of storage rack 35. Storage slot is formed with, for example, a groove extending in the front-rear direction, into which component supply unit 92 is inserted from the front side and stored. Component supply unit 92 stored in unit storage shed 3 does not matter whether component container 91 is loaded. In FIG. 2, one component supply unit 92 is illustrated, but in actuality, multiple component supply units 92 are stored side by side in the left-right direction.

Multiple storing side connectors 36, which are arranged in the left-right direction corresponding to the storage slots, are provided on a rear face of the inner side of storage rack 35. When component supply unit 92 is stored in the storage slot, the unit side connector provided on the rear side of component supply unit 92 is automatically fitted into storing side connector 36. As a result of this fitting, component supply unit 92 is supplied with power and is communicatively connected to storage shed control section 39. Component supply unit 92 stores the information on its own identification code in a built-in memory. Therefore, storage shed control section 39 can acquire the identification codes of all stored component supply units 92 by the communication and recognize the identification code in association with the position of the storage slot.

There may be at least one unit storage shed 3, and additional unit storage shed 3 can be installed. When additional unit storage shed 3 is installed, multiple unit storage sheds 3 are disposed adjacent to each other in the left-right direction. As a result, multiple upper section guides 32 are connected in the left-right direction to form a long movement guide. Similarly, multiple lower section guides 33 are connected in the left-right direction to form a long movement guide.

As illustrated in FIG. 1, container loader 4 is disposed between container warehouse 2 and unit storage shed 3 lies on the left side. Container loader 4 automatically performs the loading operation for loading component supply unit 92 with component container 91. Examples of the loading operation include an operation of assembling the tape reel corresponding to component container 91 with respect to the feeder device corresponding to component supply unit 92, an operation of pulling out the carrier tape from the tape reel to cut an unnecessary portion of a distal end, and an operation of advancing the distal end of the carrier tape after cutting to a predetermined position in the feeder device.

Container loader 4 also includes an unloading function of removing component container 91 from component supply unit 92. Container loader 4 is formed in a box shape. Container insertion port 41 through which component container 91 is inserted is provided on the left side of container loader 4. Unit insertion port 42 through which component supply unit 92 is inserted is provided in an upper right portion of the front face of container loader 4.

Container loader 4 includes code reader 43 and loader control section 49 (see FIG. 3). Code reader 43 is controlled by loader control section 49. Code reader 43 reads the identification code attached to inserted component container 91 and component supply unit 92, and delivers the read result to loader control section 49. As a result, loader control section 49 can generate load information V associating an individual of component container 91 with an individual of component supply unit 92, which is loaded with component container 91. Loader control section 49 controls the execution of the loading operation described above.

An upper section guide extending in the left-right direction is provided at a substantially intermediate height of the front face of container loader 4 (not illustrated). A lower section guide extending in the left-right direction is provided on a lower portion of the front face of container loader 4 (not illustrated). The upper section guide and the lower section guide are disposed at the same height as upper section guide 32 and lower section guide 33 of unit storage shed 3 and are formed in the same shape.

Container conveyance robot 5 conveys component container 91 between container warehouse 2 and container loader 4. Container conveyance robot 5 is a conveyor robot in an embodiment of a non-moving robot that does not require movement. Container conveyance robot 5 is configured to include an annular conveyance conveyor, a conveyor drive control section, and the like. Conveyance conveyor rotates in a state in which component container 91 is mounted. The conveyor drive control section controls the rotation and the stop of the conveyance conveyor. As a result, container conveyance robot 5 conveys and inserts component container 91 at delivery port 21 of container warehouse 2 to container insertion port 41 of container loader 4. Container conveyance robot 5 is controlled by set-up control section 8.

Container conveyance robot 5 may have a conveyance function in the opposite direction. Further, container conveyance robot 5 may be an arm robot in another embodiment of a non-moving robot. The arm robot conveys component container 91 by using an end effector holding component container 91 and a movable arm portion.

Maintenance device 7 is disposed side by side on the right side of unit storage shed 3 lies on the right side. Maintenance device 7 is formed in a box shape and includes an insertion port for component supply unit 92. Maintenance device 7 performs the maintenance of component supply unit 92. An upper section guide extending in the left-right direction is provided at a substantially intermediate height of the front face of maintenance device 7 (not illustrated). A lower section guide extending in the left-right direction is provided on a lower portion of the front face of maintenance device 7 (not illustrated). The upper section guide and the lower section guide are disposed at the same height as upper section guide 32 and lower section guide 33 of unit storage shed 3 and are formed in the same shape.

Landing station 61 is disposed side by side on the right side of maintenance device 7. Landing station 61 also serves as a carry-out station for carrying out component supply unit 92 in which component container 91 is loaded toward the component mounter 98 and a carry-in station for carrying in component supply unit 92 that has been used in the component mounter 98. At landing station 61, the loading and unloading of conveyance vehicle 66 to be started and arrival are performed, and further, the set-up on unit storage 64 is performed. Landing station 61 is formed in a rectangular parallelepiped frame shape. Two unit storages 64 are mounted on the upper face of landing station 61.

Unit storage 64 stores multiple component supply units 92. Unit storage 64 is installed on component mounter 98 in a state in which multiple component supply units 92 are stored, so as to enable the supply of components. Unit storage 64 need not be installed in component mounter 98 but may improve the efficiency of the set-up work, the transportation, or the like of multiple component supply units 92.

An upper section guide extending in the left-right direction is provided on an upper portion of the front face of landing station 61 (not illustrated). A lower section guide extending in the left-right direction is provided on a lower portion of the front face of landing station 61 (not illustrated). The upper section guide and the lower section guide are disposed at the same height as upper section guide 32 and lower section guide 33 of unit storage shed 3 and are formed in the same shape. From container loader 4 to landing station 61 via three unit storage sheds 3 and maintenance device 7, each of all upper section guides (32) and lower section guides (33) is connected side by side in the left-right direction to form a long movement guide.

Unit conveyance robot 6 moves along with multiple unit storage sheds 3 arranged side by side and conveys component supply unit 92 between unit storage 3 and container loader 4. Further, unit conveyance robot 6 conveys component supply unit 92 to maintenance device 7 or landing station 61. As illustrated in FIG. 2, unit conveyance robot 6 is formed so as to be longitudinally long. Unit conveyance robot 6 includes a guide member and a movement drive section on the rear side.

The guide member engages with a movement guide including multiple section guides 32 and 33. As a result, the entire weight of unit conveyance robot 6 is supported by the movement guide, and the movement direction is predefined. The movement drive section operates, for example, by using a non-contact power supply device or a battery (not illustrated) as a power source. The movement drive section is configured to include, for example, a combination of traveling wheels and a drive motor, or a movement mechanism to which a linear motor is applied. As a result, unit conveyance robot 6 moves along the movement guide from container loader 4 to the front side of landing station 61.

Unit conveyance robot 6 further includes a unit holding space and a unit operating mechanism. The unit holding space is a space defined in the inner portion of unit conveyance robot 6. The unit holding space temporarily holds component supply unit 92 to be conveyed. The unit operating mechanism receives and delivers component supply unit 92 between the unit holding space and other devices. The other devices are unit insertion port 42 of container loader 4, storage rack 35 of unit storage shed 3, the insertion port of maintenance device 7, and unit storage 64 on landing station 61. At the time of reception and delivery, since the height of unit conveyance robot 6 is appropriately maintained by the engagement of the guide member and the movement guide, the reception and delivery operation is stabilized. Unit conveyance robot 6 is controlled by set-up control section 8.

Traveling path 65 is laid from the front side of landing station 61 to board work line 97 and unit warehouse 13. In FIG. 1, one board work line 97 is illustrated, but multiple board work lines 97 may be disposed along the traveling path 65. It is preferable that multiple conveyance vehicles 66 traveling on traveling path 65 are provided, and conveyance vehicles 66 are travel-controlled so as to avoid a collision. Multiple conveyance vehicles 66 may be shared by first set-up line 11 and second set-up line 12 or may be dedicated for each line. Conveyance vehicle 66 may be an AGV of a type in which physical traveling path 65 is unnecessary and travels by referring to information about the traveling path on the map data.

Conveyance vehicle 66 travels in accordance with a wireless command from set-up control section 8 and loads and unloads component supply unit 92 or unit storage 64. Conveyance vehicle 66 conveys component supply unit 92 between storage and delivery port 14 of unit warehouse 13 and landing station 61. Further, conveyance vehicle 66 conveys component supply unit 92 or unit storage 64 between landing station 61 and component mounter 98 in board work line 97. Conveyance vehicle 66 appropriately reports a progress status of the conveyance operation to set-up control section 8.

As illustrated in FIG. 1, second set-up line 12 is configured to include four unit storage sheds 3, container loader 4, container conveyance robot 5, unit conveyance robot 6, landing station 61, and the like, and does not include maintenance device 7. Since the structure and the like of each constituent element of second set-up line 12 are the same as first set-up line 11 except that the directions thereof are reversed from those of first set-up line 11, thereby repetitive descriptions thereof will be omitted. By disposing first set-up line 11 and second set-up line 12 so as to face each other, an operator can enter between the two lines to easily perform inspection and maintenance.

2. Configuration Related to Control of Set-Up System 1

Next, a configuration related to control of set-up system 1 will be described. As illustrated in FIG. 3, set-up control section 8 is communicatively connected to production management device 95. Production management device 95 is communicatively connected to line control section 96. Further, line control section 96 is communicatively connected to each of multiple types of board work machines constituting board work line 97. Board work line 97 is a production line for mounting components on a board to mass-produce a board product. Component mounter 98 constituting board work line 97 is installed with component supply unit 92, in which the set-up was already performed, or unit storage 64 so that the components can be supplied.

Production management device 95 manages a production plan and a production progress status of the board product. Line control section 96 controls the operation of board work line 97 based on the production plan received from production management device 95. Further, line control section 96 sequentially transmits the production progress status in board work line 97 to production management device 95.

On the other hand, set-up control section 8 is communicatively connected to unit warehouse control section 19, container warehouse control section 29, storage shed control section 39, and loader control section 49. Further, set-up control section 8 controls container conveyance robot 5, unit conveyance robot 6, and conveyance vehicle 66. Further, load information memory section 81 attached to set-up control section 8 stores load information V. Set-up control section 8 includes a man-machine interface (an input section, a display section, a wireless communication section, or the like) for exchanging information with the operator.

Various information including load information V is appropriately transmitted and received between the control elements described above. Further, all of each control element described above needs not to be independent hardware. For example, multiple control elements may be achieved by different software in one computer device. Further, for example, set-up control section 8 may be achieved as a partial function of production management device 95. Further, the communication connection or the information transmission described above may be performed by using a wireless communication device. The control functions of set-up control section 8 and the like will be described in detail in the following description of operations.

3. Operation of Set-Up System 1

Figure 4:
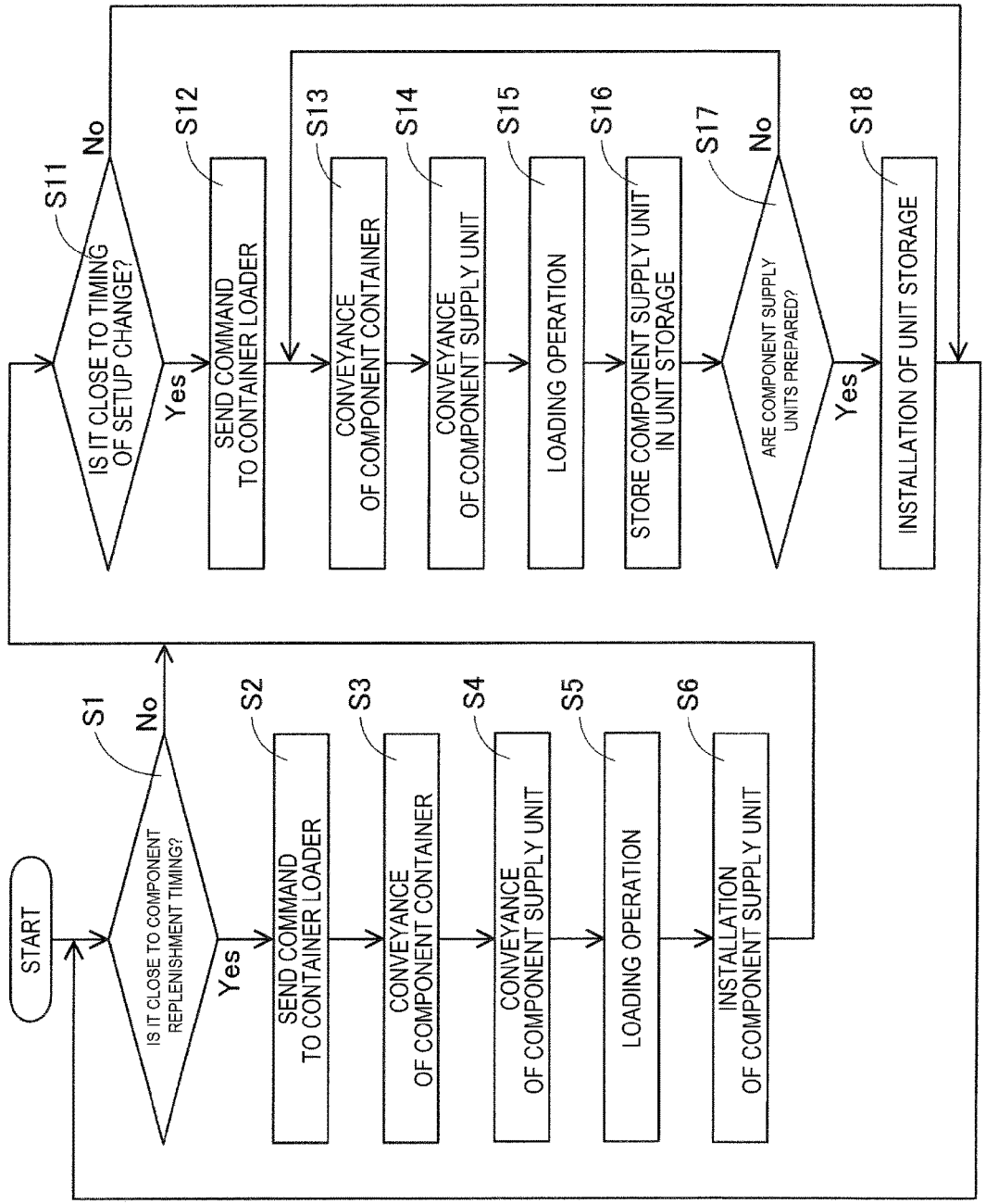
FIG. 4 is a diagram illustrating an operation flow for describing a control operation of a set-up control section in the first embodiment.

Next, the operation of set-up system 1 will be described with reference to FIG. 4. In step S1 in FIG. 4, set-up control section 8 determines whether a component replenishment timing due to a component shortage is close with reference to the production progress status of the board product managed by production management device 95. For example, it is determined whether the remaining number of components of component container 91 of component supply unit 92 installed on component mounter 98 is decreased to a predefined number or less. When the component replenishment timing is close, set-up control section 8 determines that right now is the timing of performing the loading operation and executes steps S2 to S6. When the component replenishment timing is not close, set-up control section 8 immediately advances the control to step S11. It is needless to say that the timing of performing the loading operation is determined with a margin exceeding the required time of the loading operation with respect to the component shortage prediction time.

In step S2, set-up control section 8 determines, based on load information V, whether the carry-out component supply unit, which is component supply unit 92 in which component container 91 required by component mounter 98 is loaded, is stored in unit storage shed 3. When the carry-out component supply unit is stored (when the set-up was already performed), set-up control section 8 omits the set-up work to step S5 and advances the control to step S6. Further, when the carry-out component supply unit is not stored, set-up control section 8 selects component container 91 of a component type requiring replenishment and selects component supply unit 92 in which component container 91 can be loaded. Next, set-up control section 8 commands container loader 4 to perform the loading operation while designating the identification codes of component container 91 and component supply unit 92.

In the next step S3, set-up control section 8 designates the identification code of component container 91, commands container warehouse control section 29 to perform delivery, and commands container conveyance robot 5 to perform conveyance. Container warehouse control section 29 controls actuator 22 in accordance with the command and sends component container 91 to delivery port 21. Container conveyance robot 5 conveys component container 91 at delivery port 21 to container insertion port 41 of container loader 4 in accordance with the command.

In the next step S4, first, set-up control section 8 checks a location position of component supply unit 92. When the location position is any one of unit storage sheds 3, set-up control section 8 designates the identification code of component supply unit 92 and commands unit conveyance robot 6 to convey component supply unit 92. Unit conveyance robot 6 picks up component supply unit 92 from unit storage shed 3 in accordance with the command and conveys component supply unit 92 to unit insertion port 42 of container loader 4.

Further, when the location position is unit warehouse 13, set-up control section 8 designates the identification code of component supply unit 92, commands unit warehouse control section 19 to perform delivery, commands conveyance vehicle 66 to perform conveyance by wireless communication, and commands unit conveyance robot 6 to perform conveyance. As a result, component supply unit 92 is conveyed from unit warehouse 13 to unit insertion port 42 of container loader 4 via landing station 61. Steps S3 and S4 may be executed in parallel, or the execution procedure may be exchanged.

In the next step S5, first, loader control section 49 of container loader 4 uses code reader 43 and checks that there are no errors in the identification codes of component container 91 and component supply unit 92 conveyed and inserted. Next, container loader 4 loads component supply unit 92 with component container 91 to form a carry-out component supply unit. After the loading operation, loader control section 49 creates load information V in which the identification code of component container 91 and the identification code of component supply unit 92 in which component container 91 is loaded are associated with each other, and transmits load information to set-up control section 8. Created load information V is shared by unit warehouse 13, unit storage shed 3, and component mounter 98 by the communication or the like.

In the next step S6, set-up control section 8 controls so as to install the carry-out component supply unit on component mounter 98. Specifically, set-up control section 8 commands unit conveyance robot 6 and conveyance vehicle 66 to convey the carry-out component supply unit. Further, when the carry-out component supply unit is stored in unit storage shed 3 in step S2, set-up control section 8 controls unit conveyance robot 6 to preferentially move the carry-out component supply unit to landing station 61. As a result, since the carry-out component supply unit, in which the set-up was already performed, is preferentially used, the loading operation by container loader 4 is omitted.

Unit conveyance robot 6 conveys the carry-out component supply unit from container loader 4 or unit storage shed 3 to landing station 61 (carry-out station). Next, conveyance vehicle 66 conveys and installs the carry-out component supply unit from landing station 61 to component mounter 98. Alternatively, conveyance vehicle 66 delivers the carry-out component supply unit to the operator in the vicinity of component mounter 98.

When there is a time margin in the installation of component mounter 98, or when conveyance vehicle 66 has not arrived at landing station 61, set-up control section 8 may control to temporarily store the carry-out component supply unit in unit storage shed 3. As a result, it is possible to set up multiple carry-out component supply units. After the end of step S6, set-up control section 8 advances the control to step S11.

In step S11, set-up control section 8 determines whether the timing of performing set-up change for changing the type of the board product is close by referring to the production plan and the production progress status of the board product. For example, it is determined whether the remaining number of produced board products of the currently produced type is decreased to a predefined number or less. When the timing of performing the set-up change is close, set-up control section 8 determines that right now is the timing of performing the loading operation and executes steps S12 to S18. When the timing of performing the set-up change is not close, set-up control section 8 immediately returns the control to step S1. It is needless to say that the timing of performing the loading operation is determined with a margin exceeding the required time for necessary multiple loading operations with respect to the estimated production completion time of the current board product.

Since the operations of steps S12 to S15 are the same as the operations of steps S2 to S5, descriptions thereof will be omitted. In the next step S16, set-up control section 8 commands unit conveyance robot 6 to store the carry-out component supply unit, which is set up in step S15, in unit storage 64. Unit conveyance robot 6 conveys the carry-out component supply unit from container loader 4 or unit storage shed 3 to landing station 61 in accordance with the command and stores the carry-out component supply unit in unit storage 64.

In the set-up change, it is generally necessary to perform multiple loading operations to arrange multiple carry-out component supply units. Therefore, in step S17, set-up control section 8 determines whether all the carry-out component supply units required for the set-up change are prepared in unit storage 64. While all the carry-out component supply units are not prepared, set-up control section 8 repetitively executes steps S12 to S17. When all the carry-out component supply units are prepared in unit storage 64 by repetition, set-up control section 8 advances the control to step S18.

In step S18, set-up control section 8 commands conveyance vehicle 66 to install set-up unit storage 64 on component mounter 98. Conveyance vehicle 66 conveys and installs unit storage 64 from landing station 61 to component mounter 98 in accordance with the command. Alternatively, conveyance vehicle 66 delivers unit storage 64 to the operator in the vicinity of component mounter 98. After the end of step S18, set-up control section 8 returns the control to step S1.

Next, an operation will be described in a case where component supply unit 92, which has been used in component mounter 98, is carried in landing station 61 (carry-in station) by conveyance vehicle 66. Set-up control section 8 processes component supply unit 92 carried in landing station 61 based on at least one of the production plan and the production progress status, or based on the command from production management device 95.

To describe the process more specifically, set-up control section 8 investigates whether there is a reuse plan in the near future in the production plan based on load information V about the carried-in component supply unit 92. When there is a use plan, set-up control section 8 controls unit conveyance robot 6 to store component supply unit 92 in which component container 91 is loaded in unit storage shed 3 as it is. Unit conveyance robot 6 conveys and stores component supply unit 92 from landing station 61 to unit storage shed 3 in accordance with the control. As a result, the loading operation for the next use is omitted.

Further, when there is no use plan, set-up control section 8 controls unit conveyance robot 6 and container loader 4 to remove component container 91 from component supply unit 92. Unit conveyance robot 6 conveys component supply unit 92 from landing station 61 to container loader 4 in accordance with the control. Container loader 4 removes component container 91 from component supply unit 92 by using an unloading function. Removed component container 91 is returned to container warehouse 2 and stored. On the other hand, component supply unit 92 is stored in unit storage shed 3 or stored in unit warehouse 13.

Further, when maintenance of component supply unit 92 in first set-up line 11 is performed, component supply unit 92, which is a target for the maintenance, is conveyed to maintenance device 7 by unit conveyance robot 6 in first set-up line 11. When the maintenance of component supply unit 92 in second set-up line 12 is performed, component supply unit 92, which is a target for the maintenance, is conveyed to maintenance device 7 by unit conveyance robot 6 and conveyance vehicle 66 in second set-up line 12, and unit conveyance robot 6 in first set-up line 11. When the maintenance of component supply unit 92 in unit warehouse 13 is performed, component supply unit 92, which is a target for the maintenance, is conveyed to maintenance device 7 by conveyance vehicle 66, and unit conveyance robot 6 in first set-up line 11. After the maintenance in maintenance device 7 is ended, component supply unit 92 is returned to the original position.

In component supply unit set-up system 1 of the first embodiment, component container 91 is conveyed from container warehouse 2 to container loader 4 by container conveyance robot 5, and component supply unit 92 is conveyed from unit storage shed 3 to container loader 4 by unit conveyance robot 6. Further, container loader 4 automatically performs the loading operation for loading component supply unit 92 with component container 91. Further, component supply unit 92 in which component container 91 is loaded by using the loading operation is returned to unit storage shed 3 by unit conveyance robot 6 or is conveyed to landing station 61. Accordingly, automation of the loading operation and the related operations such as transportation before and after the loading operation is achieved.

Further, set-up control section 8 can timely determine the timing of performing the loading operation of container loader 4 based on the production plan and the production progress status of the board product. According to this configuration, since component supply unit 92, in which the loading operation was ended and the set-up was already performed, does not increase unnecessarily, the labor for management is reduced. Further, component supply unit 92 does not become a work-in-process product that cannot be diverted to other uses, so that efficient operation is enabled. Further, it is possible to reduce stagnation for the mounting operation of component mounter 98 due to the delay of the loading operation. Further, by disposing the devices related to the loading operation adjacent to each other, a space-saving system configuration is achieved.

4. Component Supply Unit Set-Up System 1A of Second Embodiment

Figure 5:
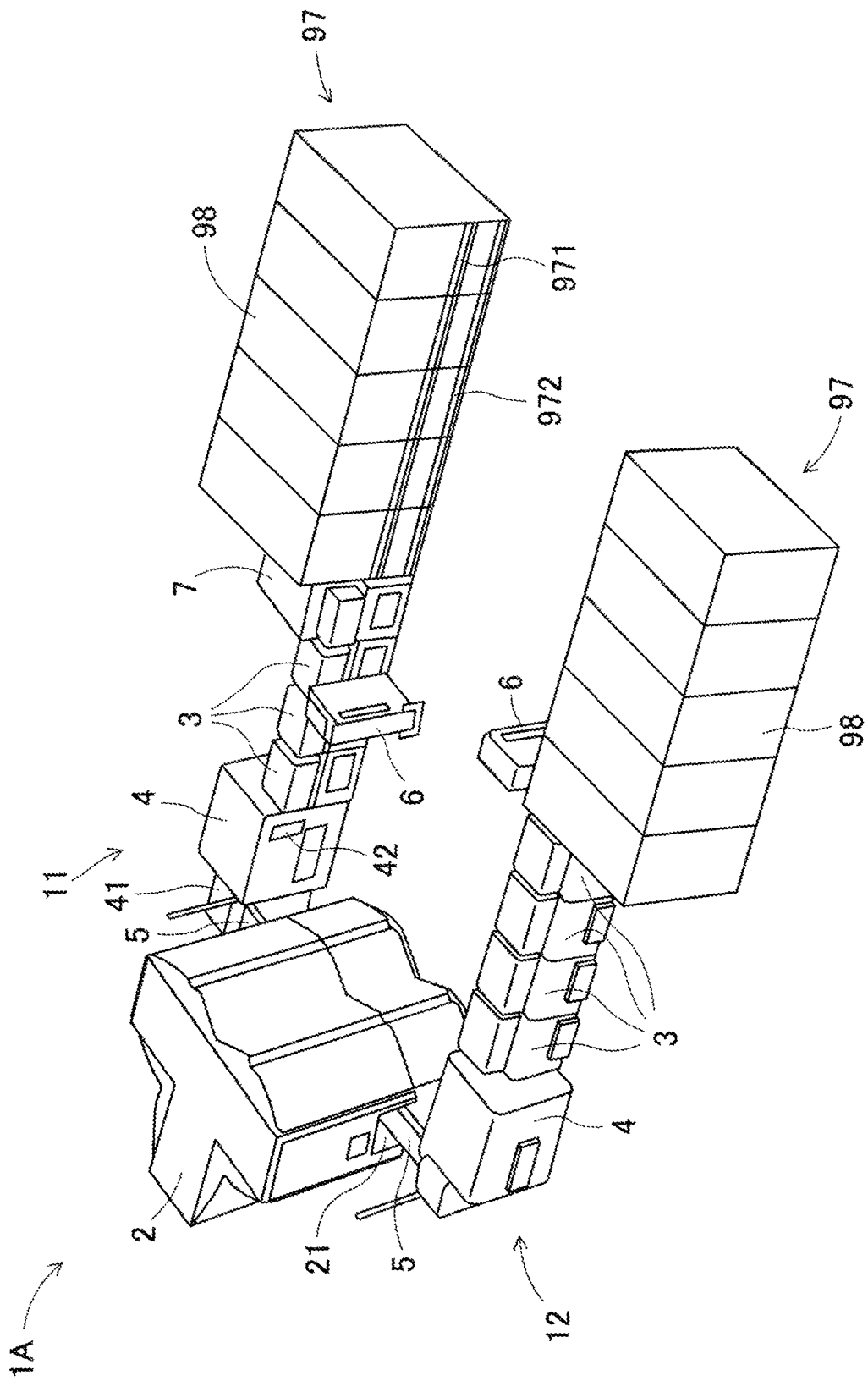
FIG. 5 is a perspective view conceptually illustrating a component supply unit set-up system of a second embodiment.

Next, set-up system 1A of a second embodiment will be described with reference to FIG. 5 mainly on points different from the first embodiment. As illustrated in FIG. 5, in the second embodiment, unit warehouse 13, landing station 61 in first set-up line 11, and landing station 61 in second set-up line 12 are omitted. Respective board work lines 97 are disposed adjacent to first set-up line 11 and second set-up line 12.

Each of the multiple types of board work machines constituting board work line 97 includes upper section guide 971 and lower section guide 972 on the front face. Upper section guide 971 and lower section guide 972 are disposed at the same height as upper section guide 32 and lower section guide 33 of unit storage shed 3 and are formed in the same shape. Therefore, upper section guide 971 and lower section guide 972 form a part of the movement guide. As a result, unit conveyance robot 6 can directly convey component supply unit 92 in which component container 91 is loaded from container loader 4 to component mounter 98.

According to the second embodiment, even when conveyance vehicle 66 is omitted, component supply unit 92 can be automatically conveyed to component mounter 98, and the set-up time can be further shortened by direct conveyance. Further, since board work line 97 is disposed adjacent to set-up system 1A, a further space saving is achieved.

5. Application and Modification of Embodiment In the first embodiment, maintenance device 7 may be disposed at a position away from first set-up line 11 or second set-up line 12. In this case, conveyance vehicle 66 conveys component supply unit 92 to maintenance device 7. Further, the conveyance vehicle 66 may be omitted, and component supply unit 92 or unit storage 64 may be conveyed to component mounter 98 by hand. Further, unit warehouse 13 or maintenance device 7 may be omitted. Further, the determination of the component replenishment timing and the timing of performing the set-up change described in the operation flow of FIG. 4 may be performed by production management device 95. In this case, set-up control section 8 advances the control according to the command of performing the loading operation from production management device 95.

Further, conveyance vehicle 66 of the first embodiment may return unit storage 64, which has been used in component mounter 98, to landing station 61. Thereafter, multiple component supply units 92 in unit storage 64 are processed as described above according to the presence or absence of a use plan in the near future. Further, the first and second embodiments are capable of various applications and modifications.

REFERENCE SIGNS LIST 1,1A: component supply unit set-up system
13: unit warehouse
19: unit warehouse control section
2: container warehouse
21: delivery port 22: actuator
23: code reader
29: container warehouse control section
3: unit storage shed
32: upper section guide
33: lower section guide
35: storage rack
39: storage shed control section
4: container loader
43: code reader
49: loader control section
5: container conveyance robot
6: unit conveyance robot
61: landing station
64: unit storage
66: conveyance vehicle
8: set-up control section
81: load information memory section
91: component container
92: component supply unit
95: production management device
971: upper section guide
972: lower section guide
98: component mounter
V: load information

The invention claimed is:

1. A component supply unit set-up system comprising:
a container warehouse configured to store multiple component containers for containing multiple components;
a unit storage shed configured to store multiple component supply units used when the components, which are contained in the component containers, are supplied in a mounting operation performed by a component mounter;
a container loader configured to load the component supply unit with the component container;
a container conveyance robot configured to convey the component container between a delivery port of the container warehouse and an insertion port the container loader; and
a unit conveyance robot configured to convey the component supply unit between the unit storage shed and the container loader.

2. The component supply unit set-up system according to claim 1,
wherein the container conveyance robot is a non-moving robot that does not need to move between the container warehouse and the container loader disposed close to each other, and
the unit conveyance robot is a moving robot that moves between the unit storage shed and the container loader or moves along the unit storage shed.

3. The component supply unit set-up system according to claim 1,
wherein one of the container warehouse and multiple sets of the unit storage shed, the container loader, the container conveyance robot, and the unit conveyance robot are provided.

4. The component supply unit set-up system according to claim 1,
wherein the unit conveyance robot conveys the component supply unit, which is loaded with the component container by the container loader, to the component mounter.

5. The component supply unit set-up system according to claim 1, further comprising:
a conveyance vehicle configured to convey the component supply unit, which is loaded with the component container by the container loader, to the component mounter.

6. The component supply unit set-up system according to claim 5, further comprising:
a unit warehouse configured to be separate from the unit storage shed and store more the component supply units than the unit storage shed,
wherein the conveyance vehicle conveys the component supply unit that is delivered from the unit warehouse.

7. The component supply unit set-up system according to claim 1, further comprising:
a maintenance device configured to perform maintenance on the component supply unit, and
wherein the unit conveyance robot conveys the component supply unit to the maintenance device.

8. The component supply unit set-up system according to claim 5, further comprising:
a maintenance device configured to perform maintenance on the component supply unit, and
wherein the conveyance vehicle conveys the component supply unit to the maintenance device.

9. The component supply unit set-up system according to claim 1, further comprising:
a set-up control section configured to control for selecting the component container to be conveyed from the container warehouse to the container loader, and control a timing of performing loading of the selected and conveyed component container by the container loader, based on a command from a production management device that manages at least one of a production plan and a production progress status of a board product on which the component is mounted or with reference to at least one of the production plan and the production progress status.

10. The component supply unit set-up system according to claim 9, further comprising:
a load information memory section configured to store load information in which an individual of the component containers and an individual of the component supply units, which are loaded with the component container, are associated with each other.

11. The component supply unit set-up system according to claim 10, further comprising:
a carry-out station configured to carry out the component supply unit, which is loaded with the component container, toward the component mounter,
wherein the set-up control section determines whether a carry-out component supply unit, which is the component supply unit loaded with a component container required by the component mounter, is stored in the unit storage shed based on the load information and controls the unit conveyance robot to preferentially move the carry-out component supply unit to the carry-out station when the carry-out component supply unit is stored in the unit storage shed.

12. The component supply unit set-up system according to claim 10, further comprising:
a carry-in station configured to carry in the component supply unit that has been used in the component mounter,
wherein the set-up control section controls the unit conveyance robot such that the component supply unit, which is carried in the carry-in station, is stored in the unit storage shed while the component container is loaded in the component supply unit or controls the unit conveyance robot and the container loader to remove the component container from the component supply unit, which is carried in the carry-in station, based on at least one of the production plan and the production progress status or based on the command from the production management device.

13. The component supply unit set-up system according to claim 1,
wherein the component container is a tape reel in which a carrier tape containing the multiple components is wound, and
the component supply unit is a feeder device loaded with the tape reel or is a reel cassette loaded with the tape reel and formed separately from a feeder main body portion having a feeding mechanism of the carrier tape.

14. The component supply unit set-up system according to claim 1,
wherein the container conveyance robot includes an annular conveyance conveyor, a conveyor that rotates when the component container is mounted.

* * * * *